United States Patent [19]

Craft

[11] Patent Number: 4,590,513
[45] Date of Patent: May 20, 1986

[54] ODD HARMONIC SIGNAL GENERATOR

[75] Inventor: Jack Craft, Bridgewater, N.J.

[73] Assignee: RCA Corporation, Princeton, N.J.

[21] Appl. No.: 537,815

[22] Filed: Sep. 30, 1983

[51] Int. Cl.[4] .................... H04N 9/78; H02M 5/275
[52] U.S. Cl. .................................. 358/31; 331/76; 331/77; 363/163
[58] Field of Search .................. 331/76, 77; 328/16; 363/163; 358/21 R, 31

[56] References Cited

U.S. PATENT DOCUMENTS

| | | | |
|---|---|---|---|
| 3,060,364 | 10/1962 | Holcomb | 363/151 |
| 3,974,460 | 8/1976 | Hongu et al. | 331/76 |
| 4,019,118 | 4/1977 | Harwood | 331/76 |
| 4,224,638 | 9/1980 | Pritchard et al. | |
| 4,325,076 | 4/1982 | Harwood et al. | 358/31 |

OTHER PUBLICATIONS

Barker, R. W. J. and Reilly, E. P. J., "Odd-Order–Frequency-Multiple-Generation Technique", *Electronic Letters*, vol. 12, No. 7, (Apr. 1976), pp. 159–160.

*Primary Examiner*—John W. Shepperd
*Attorney, Agent, or Firm*—E. M. Whitacre; P. J. Rasmussen; K. N. Nigon

[57] ABSTRACT

Odd harmonic generator includes two amplitude limiting amplifiers and a frequency selective signal combining network. Sinusoidal signal at frequency of chrominance subcarrier is applied to inputs of both amplifiers. The first amplifier provides signal comprising fundamental and odd harmonic frequency components. The second amplifier provides signal comprising a fundamental frequency component and odd harmonic frequency components that are comparatively much smaller than the odd harmonic frequency components of the first amplifier's output signal. Signals are combined so that fundamental frequency components offset. Output signal at third harmonic of chrominance subcarrier frequency is used as clock signal for CCD comb filter in a color TV receiver.

10 Claims, 1 Drawing Figure

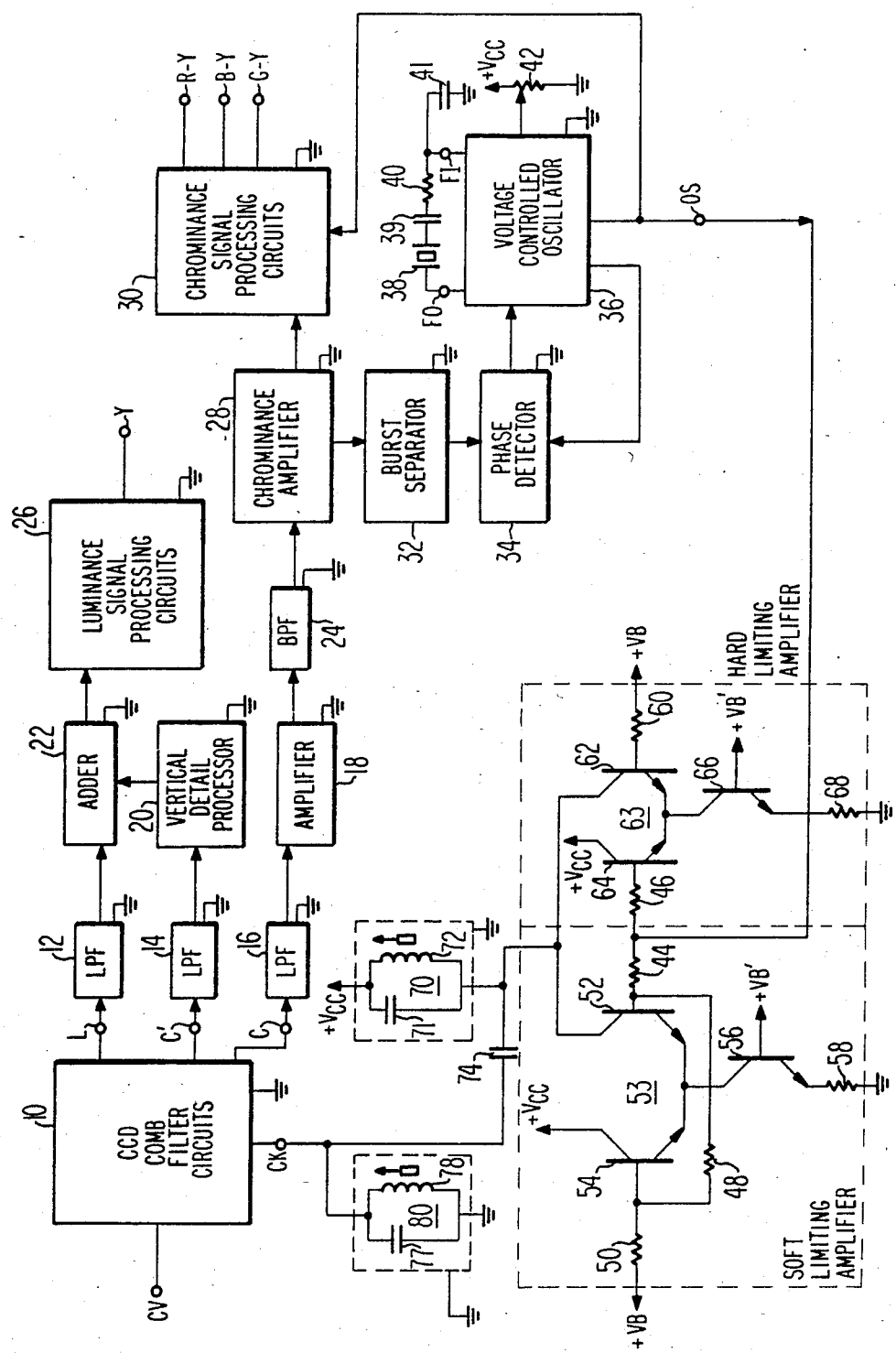

ODD HARMONIC SIGNAL GENERATOR

The present invention relates generally to odd harmonic generator circuits and particularly to odd harmonic generator circuits that, when provided with an input signal at a fundamental frequency, produce an output signal containing components at the odd harmonic frequencies of said fundamental frequency to the relative exclusion of any component at said fundamental frequency, with substantial insensitivity to input signal amplitude changes.

U.S. Pat. No. 4,325,076—Harwood describes a circuit that derives, from a sinusoidal input signal at a fundamental frequency, an output signal containing a large component at the third harmonic of said fundamental frequency and a small component at said fundamental frequency.

As disclosed in the Harwood patent, a sinusoidal input signal is applied to an inverting limiting amplifier and to a noninverting linear amplifier, and the output signals of these amplifiers are combined in a summing network. The signal appearing at the output of the summing network contains the component frequencies of the square wave output signal from the limiting amplifier minus the fundamental frequency sine wave from the linear amplifier. For a particular value of input signal amplitude, the fundamental component virtually disappears from this summed output signal. As a square wave comprises a fundamental frequency and its odd harmonics, only the third and higher order odd harmonic components remain when the fundamental component is removed. The performance of the Harwood circuit, however, is sensitive to the strength of its input signal. If the amplitude of the input signal is not held at a particular value, varying amounts of the fundamental frequency will appear in the summed output signal, lowering the ratio of the third and higher order harmonic components to the fundamental component.

The present invention, in response to input signals of varying amplitudes, provides output signals with more uniform ratios of their odd harmonic components to their fundamental component than would be provided by the Harwood circuit without compensation for input signal amplitude variations.

An odd harmonic generator according to the present invention includes: a source of sinusoidal input signals; two limiting amplifiers, having different characteristics; means for combining the outputs of the two amplifiers; and means for filtering the combined output signal. A first one of the limiting amplifiers, functioning as a hard limiting amplifier, produces an output waveform characterized by a fast rise to a positive limiting value and a fast fall to a more negative value, (i.e., a square wave or steeply pitched trapezoidal wave). A second one of the limiting amplifiers, functioning as a soft limiting amplifier, produces an output waveform with flattened peaks that has slow rise and fall times compared to the output waveform of the hard limiting amplifier. The output signals of these amplifiers are combined in antiphasal relation.

The hard limited signal is rich in odd harmonics of the fundamental frequency while the soft limited signal has a fundamental component much larger than any of its harmonic components. With suitable elevation of the gain of the soft limiting amplifier relative to the gain of the hard limiting amplifier, the magnitudes of the fundamental components of the two output signals are made to be approximately equal. The result of combining these signals, therefore, is a signal largely composed of odd harmonic components to the relative exclusion of any fundamental component. A particular odd harmonic may be extracted from this combined signal by appropriate filtration.

In an illustrative embodiment of the present invention, both limiting amplifiers are differential amplifiers. Each differential amplifier comprises, two bipolar transistors, a current source that supplies the transistors through their interconnected emitters, an input network that couples the input signal to the base of at least one of the transistors, and a load network coupled to the collector of one of the transistors, providing an output. The amplifiers are configured such that the signals appearing at their outputs are complementary in phase, and appear across a common load, which is desirably frequency sensitive and tuned to a chosen odd harmonic.

A substantially unattenuated version of the input signal is supplied to one of the differential amplifiers with sufficient magnitude to cause hard limiting to take place, whereas the input network of the other differential amplifier introduces sufficient attenuation of the common input signal that soft limiting is a consequence. The current source for the latter differential amplifier delivers a current thereto that is sufficiently greater than the current provided by the current source of the former differential amplifier as to ensure substantial equality of the magnitudes of the fundamental frequency components in the respective outputs.

A frequency multiplier tolerant of variations in the amplitude of its signal, such as is provided by the present invention, may be used to advantage in a color television receiver, where part of the processing of received color television signals involves the use of a comb filter comprising a plurality of clocked charge coupled device (CCD) delay lines.

U.S. Pat. No. 4,096,516—Pritchard, for example, describes a comb filter circuit using clocked CCDs that is particularly well suited for separating the luminance and chrominance components from received composite video signals, and utilizes therefor a clock signal at a frequency equal to three times the color subcarrier frequency (e.g., equal to 3×3.579545 MHz or 10.738635 MHz, for receivers of NTSC type signals), derived by frequency multiplication of an output of the receiver's color reference oscillator. While such a frequency multiplied signal exhibits a frequency stability suitable for clocking purposes, it is necessary that the frequency multiplied signal be substantially free of fundamental frequency components to avoid contamination of the chrominance component output of the comb filter, as discussed, for example, in U.S. Pat. No. 4,224,638—Pritchard, et al. With practical tolerances for the parameters of the receiver's color reference oscillator, one is moreover confronted with uncertainty as to the precise amplitude of a given output of the receiver's color reference oscillator, wherefore it is herein recognized as appropriate that the frequency multiplier used for clock signal generation maintain significant fundamental frequency component suppression for an extended range of input signal amplitudes.

The sole FIGURE of the accompanying drawing illustrates a portion of a color television receiver, partially by schematic and partially by block diagram, incorporating an odd harmonic generator apparatus in accordance with the present invention for clock signal generating purposes.

In the illustrated arrangement, composite color video signals from, for example, the video detector of a color television receiver, are applied to the input terminal CV of CCD comb filter circuits 10. For explanatory purposes, a filter of the type shown in the aforementioned Pritchard patent is assumed, although other comb filter circuits would also be suitable.

Signals that appear at output terminal L of the CCD comb filter circuits 10 have been subjected to a filter characteristic exhibiting rejection notches at odd multiples of one-half the line scanning frequency. These signals are applied to a low pass filter 12 (having an illustrative pass band of from 0 to 4 MHz), that removes the high frequencies associated with the CCD clocking signals and passes a wideband combed luminance signal.

Signals that appear at output terminals C and C' of comb filter circuits 10 have been subjected to a filter characteristic exhibiting rejection notches at even multiples of one-half the line scanning frequency. The signals at output terminal C are applied to low pass filter 16 which rejects the high frequency CCD clocking signals. After amplification by amplifier 18, the signals are applied to band pass filter 24 which has an illustrative pass band from 3 to 4 MHz. The result of this filtration is a combed chrominance signal.

The low frequency components of the signals at output terminal C' are luminance components containing vertical detail information and are passed by filter 14 which illustratively has a pass band from 0 to 2 MHz. These low frequency luminance signals are applied to vertical detail processor 20 for further processing. An illustrative vertical detail processor is described in U.S. Pat. No. 4,245,237—Lagoni. Adder 22 accepts the processed vertical detail information and the combed luminance signal from filter 12 as its inputs and provides a combined luminance signal at its output. This combined luminance signal is applied to luminance signal processing circuits 26, which provide a processed luminance signal at terminal Y.

Combed chrominance signals at the output of filter 24 are applied to chrominance amplifier 28 which supplies both chrominance signal processing circuits 30 and burst separator 32. The chrominance signal processing circuits, including conventional synchronous detection circuits responsive to a color reference signal generated by a voltage controlled oscillator 36 (described below), develop a trio of color difference signal outputs that appear at output terminals R-Y, G-Y and B-Y. The luminance signal from terminal Y and the three color difference signals are combined via well known signal processing means (not illustrated) to provide red, green and blue color primary signals which can be used to reproduce color images.

Voltage controlled oscillator 36 is, illustratively, of a form described in the copending U.S. patent application Ser. No. 383,303 of R. L. Shanley, et al., and includes a noninverting amplifier having an output terminal FO and an input terminal FI. A feedback path, comprising the series combination of piezoelectric quartz crystal 38, capacitor 39, and resistor 40 in the stated order, connects terminal FO to terminal FI. Capacitor 41 couples terminal FI to a point of reference potential (e.g., ground). A potentiometer 42 is provided with one of its fixed terminals connected to the positive terminal ($+V_{cc}$) of an operating potential supply, with its other fixed terminal connected to ground, and with its adjustable tap connected to supply a control voltage input to voltage controlled oscillator 36. Voltage controlled oscillator 36 also accepts the output of phase detector 34 (described below) as a control voltage input.

With potentiometer 42 adjusted to its mid position, the frequency of the signal produced by voltage controlled oscillator 36 is determined by the resonant frequency of the series resonant circuit formed by piezoelectric quartz crystal 38 and capacitor 39. While the nominal values of the crystal and capacitor are chosen to establish a resonant frequency equal to the color subcarrier frequency (e.g., 3.579545 MHz), in actual use, deviation from these nominal values within tolerance can result in the oscillator having a slightly higher or slightly lower free-running frequency. The Q of the series resonant circuit is determined by resistor 40, which also cooperates with capacitor 41 to form a low pass filter rejecting harmonics of the oscillator's resonant frequency. Alignment of the oscillator's free running frequency to the exact color subcarrier frequency is accomplished by adjusting potentiometer 42, as described in the aforementioned application of R. L. Shanley, et al.

Burst separator 32 extracts the color synchronizing burst component from the combed chrominance signal appearing at the output of chrominance amplifier 28. This signal is applied to one input of phase detector 34, the other input being an output signal from voltage controlled oscillator 36. The output of phase detector 34 is a control signal that is applied to voltage controlled oscillator 36 to align the phase of its output signal into a fixed phase relationship with the transmitted color synchronizing burst signal.

The color reference signal at output terminal OS of the voltage controlled oscillator 36 is applied to a frequency tripler in accordance with the present invention to develop a clock signal for the aforementioned CCD comb filter circuits 10.

The frequency tripler includes a soft limiting amplifier 53 and a hard limiting amplifier 63. Amplifier 53 comprises two NPN transistors, 52 and 54, disposed in a differential amplifier configuration. The interconnected emitters of the two transistors are coupled to the collector of NPN transistor 56 which provides differential amplifier 53 with a constant current. The base of transistor 56 is connected to the positive terminal ($+VB'$) a bias potential supply. The emitter of transistor 56 is returned to ground through resistor 58.

Resistor 44 couples the base of transistor 52 to the oscillator output terminal OS. Resistor 44 forms a voltage dividing network with resistor 48, connected between the bases of transistors 54 and 52, and resistor 50 which connects the base of transistor 54 to the positive terminal ($+VB$) of a bias potential supply. The effective input signal to soft limiting amplifier 53 is the attenuated reference signal that appears across resistor 48.

The collector of transistor 54 is connected directly to operating supply terminal $+Vcc$, while the collector of transistor 52 is coupled to operating supply terminal $+Vcc$ through a frequency sensitive load circuit 70, to provide the output of soft limiting amplifier 53.

Amplifier 63 comprises two NPN transistors 62 and 64, disposed in a differential amplifier configuration. The interconnected emitters of the two transistors are connected to the collector of NPN transistor 66 which serves as a source of constant current for amplifier 63. The base of transistor 66 is directly connected to the +VB' bias supply terminal, and the emitter of transistor 66 is coupled to ground through resistor 68.

Amplifier 63 receives the color reference input signal through resistor 46, coupled between terminal OS and the base of transistor 64. The base of transistor 62 is coupled to bias supply terminal +VB through resistor 60.

The output of hard limiting amplifier 63 appears at the collector of transistor 62, which is coupled to operating supply terminal +Vcc through the frequency sensitive load circuit 70. The collector of transistor 64 is connected directly to operating supply terminal +Vcc.

Frequency sensitive load circuit 70, connected between the joined collectors of transistors 52,62 and operating potential terminal Vcc, serves both to combine the signals produced by amplifiers 53,63 and to filter this combined signal. Load circuit 70 comprises capacitor 71 coupled in parallel with adjustable inductor 72 to form a parallel resonant circuit which is tuned to resonate at the third harmonic of the color reference frequency. A capacitor 74 links the joined collectors of transistors 52 and 53 to the clock input terminal CK of CCD comb filter circuits 10. An additional parallel resonant circuit 80, formed by capacitor 77 in shunt with adjustable inductor 78, is connected between terminal CK and ground. Parallel resonant circuit 80 is also tuned to resonate at the third harmonic of the color reference signal.

In operation of the illustrated frequency tripler, the magnitude of the color reference signal appearing at oscillator output terminal OS is sufficiently great as to drive amplifier 63 into hard limiting, whereas the input signal attenuation introduced by the divider network 44,48,50 results in amplifier 53 being driven into soft limiting only. By an appropriate reduction of the resistance value of resistor 58 relative to the resistance value of resistor 68, the current supplied to amplifier 53 by current source transistor 56 is desirably elevated in magnitude relative to the current supplied to amplifier 63 by current source transistor 66 to a degree sufficient to permit substantial equalization of the magnitudes of the fundamental frequency components of the respective amplifier outputs.

With an inverted version of the soft limiting amplifier's input signal appearing at the collector of output transistor 52, and a noninverted version of the hard limiting amplifier's input signal appearing at the collector of output transistor 62, substantial mutual cancellation of the fundamental frequency components is obtained in the common load connected to these collectors. However, with the relative magnitudes of the accompanying harmonic components significantly different in the respective limiting amplifier outputs (i.e, with the magnitudes of the harmonic components of the hard limited waveform significantly exceeding the magnitudes of the harmonic components of the soft limited waveform), a residual third harmonic component of significant magnitude appears across the common load.

Band pass filtering action provided by the parallel resonant circuits 70,80 provides further suppression of the undesired fundamental frequency component relative to the desired third harmonic component in the output signal delivered to clock input terminal CK, with elements 70,74,80 forming a band pass filter of a double tuned, high side capacity coupled type. The relatively sharp-skirted characteristic of this type of band pass filter also assures substantial attenuation of harmonic components higher in order than the desired third harmonic component.

It is recognized that the presence of the voltage dividing network 44,48,50 at the input of the soft limiting amplifier 53 can introduce a slight phase shift of the input signal therefor that may compromise the desired fundamental frequency component cancellation in the common load if not compensated for. However, by introduction of resistor 46, with a suitable resistance value, in the input circuit of the hard limiting amplifier 63, a compensating phase shift of the input signal for the latter amplifier is obtained.

By providing a DC level for the oscillator output at terminal OS which substantially matches the potential at bias supply terminal +VB, and by suitably matching the resistance values for resistors 46 and 60, as well as suitably matching the resistance values for resistors 44 and 50, a desired quiescent balanced condition for the respective differential amplifiers 53 and 63 is readily obtained.

The precise amplitude of the oscillator output at terminal OS will depend, in each practical instance, on a number of factors including, for example, the adjustment of potentiometer 42 required in a given receiver to properly set the oscillator's free-running frequency, and the pulling of the oscillator frequency, via the control exercised by phase detector 34, required for synchronization with the broadcast signal being received at a particular time. The drive magnitude provided at terminal OS is chosen so that, for the anticipated range of such amplitude variations, both of the amplifiers 53 and 63 are maintained in a limiting mode.

With both contributing amplifiers operating in a nonlinear limiting mode, a tracking of fundamental frequency component magnitudes to a degree appropriate for maintenance of substantial fundamental component cancellation, as input signal amplitude varies, appears to be more readily attained than in an instance (exemplified by the aforementioned Harwood patent) where the output of a linear amplifier is summed with the output of a non-linear limiting amplifier.

Illustrative values for circuit parameters of the FIGURE are as follows:

| | |
|---|---|
| Capacitor 39 | 100 picofarads |
| Capacitor 41 | 68 picofarads |
| Resistor 40 | 1300 ohms |
| Resistors 44, 48, 50 | 4950 ohms |
| Resistors 46, 60 | 2 kilohms |
| Resistor 58 | 1 kilohm |
| Resistor 68 | 1255 ohms |
| +Vcc | 11.2 volts |
| +VB | 5.2 volts |
| +VB' | 1.2 volts |

What is claimed is:

1. An odd harmonic signal generator comprising:
   means for providing a sinusoidal input signal wherein the amplitude of said sinusoidal input signal may vary over a range of values;
   a soft limiting amplifier, responsive to said sinusoidal input signal and providing an amplitude limited output signal for all amplitude values of said sinusoidal input signal within said range of amplitude values;
   a hard limiting amplifier responsive to said sinusoidal input signal and providing an amplitude limited output signal for all amplitude values of said sinusoidal input signal within said range of amplitude values, wherein the phase of said second amplifier output signal is the opposite of the phase of said first amplifier output signal; and means for combining the output signals from said soft limiting and hard limiting amplifiers to provide a combined output signal comprising components at odd harmonics of the fundamental frequency of said sinousoidal input signal to the relative exclusion of a component at said fundamental frequency.

2. A signal generator according to claim 1 wherein:

said soft limiting amplifier comprises a first transistor and a second transistor, each having base, collector and emitter electrodes, said emitter electrodes of said first and second transistors being coupled to each other and to a common current source, said base electrodes of said first transistor being coupled to receive said input signal, and said collector electrode of said first transistor providing an output signal with a phase substantially the opposite of the phase of said input signal;

said hard limiting amplifier comprises a third transistor and a fourth transistor, each having base, collector and emitter electrodes, said emitter electrodes of said third and fourth transistors being coupled to each other and to a common current source, wherein said common current source of said hard limiting amplifier provides a current of a lesser magnitude that the current provided by said common current source of said soft limiting amplifier, said base electrode of said third transistor being coupled to said input signal providing means to receive said sinusoidal input signal, and said collector electrode of said fourth transistor providing an output signal with a phase substantially the same as the phase of said sinusoidal input signal.

3. An odd harmonic generator according to claim 2 wherein:

said soft limiting amplifier includes an input signal attenuation network comprising a first resistor coupling said input signal providing means to said base electrode of said first transistor, a second resistor intercoupling said base electrodes of said first and second transistors, and a third resistor coupling said base electrode of said second transistor to a point of reference potential; an attenuated version of said sinusoidal input signal appearing across said second resistor.

4. An odd harmonic generator according to claim 3 wherein said output signal combining means includes a load common to said hard limiting and soft limiting amplifiers.

5. An odd harmonic generator according to claim 4 wherein said common load comprises a tuned circuit providing a relatively high impedance at a chosen odd harmonic of said fundamental frequency of said sinusoidal input signal and a relatively low impedance at said fundamental frequency.

6. A third harmonic signal generator circuit comprising:

means for providing a sinusoidal input signal wherein the amplitude of said sinusoidal input signal may vary over a range of values;

a first amplifier responsive to said sinusoidal input signal and providing an amplitude limited output signal for all amplitude values of said sinusoidal input signal within said range of amplitude values, wherein said output signal of said first amplifier comprises a fundamental component at the fundamental frequency of said sinusoidal input signal and a third harmonic component at the third harmonic of said fundamental frequency;

a second amplifier responsive to said sinusoidal input signal for developing an amplitude limited output signal for all amplitude values of said sinusoidal input signal within said range of amplitude values, wherein said output signal of said second amplifier comprises a fundamental component at the fundamental frequency of said sinusoidal input signal having an amplitude substantially equal to the amplitude of said fundamental component of said first amplifier output signal, and a third harmonic component at the third harmonic of said fundamental frequency having an amplitude substantially greater than the amplitude of said third harmonic component of said first amplifier output signal; and means for combining said first amplifier output signal and said second amplifier output signal in a manner producing an output signal comprising a fundamental component and a third harmonic component, wherein the amplitude of said third harmonic component is relatively greater than the amplitude of said fundamental component.

7. A third harmonic signal generator according to claim 6 wherein said signal combining means comprises a load common to both said first and second amplifiers.

8. A third harmonic signal generator according to claim 7 wherein said common load comprises a tuned circuit providing a relatively high impedance at the third harmonic of said sinusoidal input signal and a relatively low impedance at said fundamental frequency of said sinusoidal input signal.

9. In a color television receiver responsive to received composite video signals, including: clocked CCD comb filter circuits for separating a chrominance signal component from said composite video signals; chrominance signal processing circuits, responsive to said chrominance signal, and including a voltage controlled oscillator for generating a reference signal at the frequency of the color subcarrier, a burst separator circuit responsive to said chrominance signal for developing a color synchronizing burst signal, and control circuitry responsive to said color synchronizing burst signal and said reference signal for aligning the phase of said reference signal; apparatus comprising:

an attenuation network responsive to said reference signal for providing an attenuated version of said reference signal;

a first limiting amplifier coupled to the output of said attenuation network for providing an output signal including a fundamental component at the fundamental frequency of said reference signal and a third harmonic component at the third harmonic of said fundamental frequency;

a second limiting amplifier responsive to said reference signal for providing an output signal opposite in phase to said first amplifier output signal, said second amplifier output signal including a fundamental component at said fundamental frequency, wherein the magnitude of said fundamental component of said second amplifier output signal is substantially equal to the magnitude of said fundamental component of said first amplifier output signal, said second amplifier output signal further including a third harmonic component at the third harmonic of said fundamental frequency, wherein the magnitude of said third harmonic component of said second amplifier output signal is substantially greater than the magnitude of said third harmonic component of said first amplifier output signal;

means for combining said first amplifier output signal and said second amplifier output signal in an additive manner, producing an output signal comprising a fundamental component and a third harmonic component, wherein the magnitude of the third harmonic component of said combined signal is relatively greater than the magnitude of the fundamental component of said combined signal.

10. An apparatus according to claim 9 wherein a band pass filter circuit is coupled to said output signal combining means, said band pass filter circuit having a pass band centered about the third harmonic of said fundamental frequency for providing an output signal comprising a component at the third harmonic of said fundamental frequency to the substantial exclusion of a component of said fundamental frequency.

* * * * *